US010675871B2

(12) United States Patent
Tsuboi et al.

(10) Patent No.: US 10,675,871 B2
(45) Date of Patent: Jun. 9, 2020

(54) HEAD UNIT AND LIQUID EJECTION APPARATUS

(71) Applicant: BROTHER KOGYO KABUSHIKI KAISHA, Nagoya-shi, Aichi-ken (JP)

(72) Inventors: Motohiro Tsuboi, Nagoya (JP); Shogo Mori, Nagoya (JP)

(73) Assignee: BROTHER KOGYO KABUSHIKI KAISHA, Nagoya-Shi, Aichi-Ken (JP)

(*) Notice: Subject to any disclaimer, the term of this patent is extended or adjusted under 35 U.S.C. 154(b) by 0 days.

(21) Appl. No.: 15/939,450

(22) Filed: Mar. 29, 2018

(65) Prior Publication Data

US 2019/0100003 A1 Apr. 4, 2019

(30) Foreign Application Priority Data

Sep. 29, 2017 (JP) .................................. 2017-192088

(51) Int. Cl.
*B41J 2/175* (2006.01)
*B41J 2/14* (2006.01)
(Continued)

(52) U.S. Cl.
CPC ........... *B41J 2/1429* (2013.01); *B41J 2/1433* (2013.01); *B41J 2/14233* (2013.01); *B41J 2/175* (2013.01);
(Continued)

(58) Field of Classification Search
CPC ...... B41J 2/175; B41J 2/1752; B41J 2/17523; B41J 2/18; B41J 2/1433; B41J 2202/12
See application file for complete search history.

(56) References Cited

U.S. PATENT DOCUMENTS 8,517,499 B2* 8/2013 Takano ................. B41J 2/1408
347/18
2007/0200905 A1* 8/2007 Nakashima .......... B41J 2/17509
347/85
(Continued)

FOREIGN PATENT DOCUMENTS

EP      3 210 782 A2   8/2017
GB       2547951 A      9/2017
(Continued)

OTHER PUBLICATIONS

Machine Translation of 2010179499, Oguchi (Year: 2010).*
Extended European Search Report issued in related European Patent Application No. 18165175.3, dated Oct. 18, 2018.

*Primary Examiner* — Scott A Richmond
(74) *Attorney, Agent, or Firm* — Merchant & Gould P.C.

(57) ABSTRACT

A head unit includes: a head module having a nozzle surface; a casing; a first connector having a first communication opening; a second connector having a second communication opening; a first liquid-passage tube connected to the first communication opening; first and second branch-liquid-passage tubes connected to the first liquid-passage tube; a first tube joint connecting the first liquid-passage tube to the first and second branch-liquid-passage tubes; a second liquid-passage tube connected to the second communication opening; third and fourth branch-liquid-passage tubes connected to the second liquid-passage tube; and a second tube joint connecting the second liquid-passage tube to the third and fourth branch-liquid-passage tubes. The first tube joint is disposed between the second connector and the second tube joint when viewed in a direction parallel with the nozzle surface.

18 Claims, 14 Drawing Sheets

(51) Int. Cl.
  *B41J 2/21* (2006.01)
  *B41J 2/18* (2006.01)
  *B41J 29/13* (2006.01)
  *H05K 1/02* (2006.01)

(52) U.S. Cl.
  CPC ......... *B41J 2/1753* (2013.01); *B41J 2/17523* (2013.01); *B41J 2/17553* (2013.01); *B41J 2/17563* (2013.01); *B41J 2/18* (2013.01); *B41J 2/21* (2013.01); *B41J 29/13* (2013.01); *H05K 1/0272* (2013.01); *B41J 2002/14362* (2013.01); *B41J 2002/14403* (2013.01); *B41J 2002/14459* (2013.01); *B41J 2002/14491* (2013.01); *B41J 2202/12* (2013.01); *B41J 2202/19* (2013.01); *B41J 2202/20* (2013.01)

(56) References Cited

U.S. PATENT DOCUMENTS

| | | | |
|---|---|---|---|
| 2009/0141063 A1* | 6/2009 | Takano | B41J 2/1408 347/18 |
| 2013/0201255 A1 | 8/2013 | Dowell et al. | |
| 2013/0228084 A1 | 9/2013 | Brady et al. | |
| 2013/0229473 A1 | 9/2013 | Wells, Jr. et al. | |
| 2013/0293641 A1 | 11/2013 | Essen et al. | |
| 2014/0063138 A1 | 3/2014 | Takahagi et al. | |
| 2014/0292933 A1* | 10/2014 | Hagiwara | B41J 2/17563 347/47 |
| 2015/0258781 A1* | 9/2015 | Domae | B41J 2/04588 347/10 |
| 2015/0266292 A1 | 9/2015 | Yoshida | |
| 2016/0089879 A1 | 3/2016 | Tanaka | |
| 2016/0288499 A1 | 10/2016 | Sugahara et al. | |
| 2017/0253048 A1 | 9/2017 | Nishimura | |
| 2018/0215167 A1 | 8/2018 | Brandenberger et al. | |
| 2018/0361741 A1* | 12/2018 | Takino | B41J 2/14072 |
| 2019/0126649 A1* | 5/2019 | Midorikawa | B41J 2/175 |

FOREIGN PATENT DOCUMENTS

| | | | |
|---|---|---|---|
| JP | 2006212795 A | * | 8/2006 |
| JP | 2010-179499 A | | 8/2010 |
| JP | 2010179499 A | * | 8/2010 |
| JP | 2014-061704 | | 4/2014 |
| JP | 2015-509454 | | 3/2015 |
| WO | 2017/011923 A1 | | 1/2017 |

* cited by examiner

FIG.1
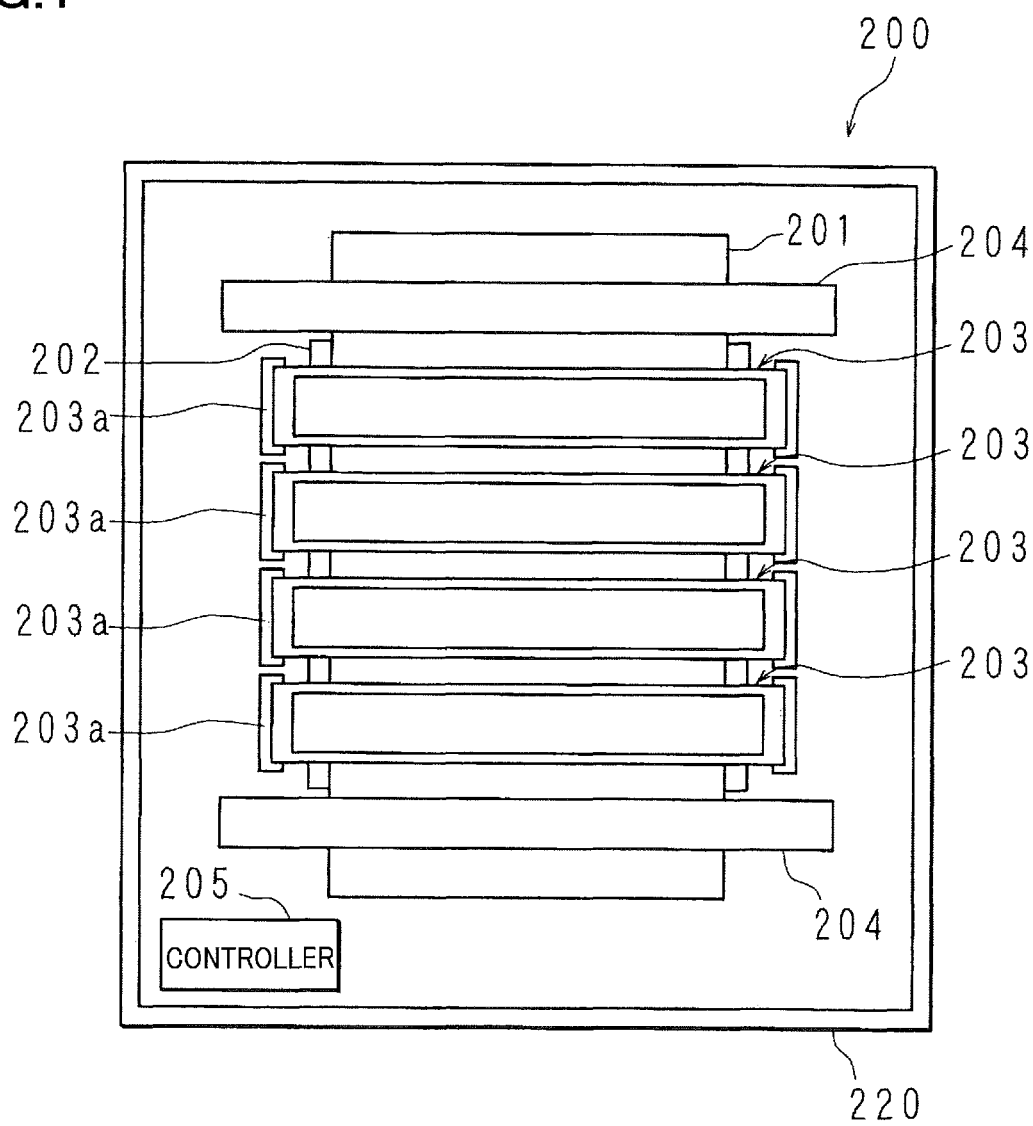
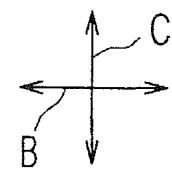

FIG.4
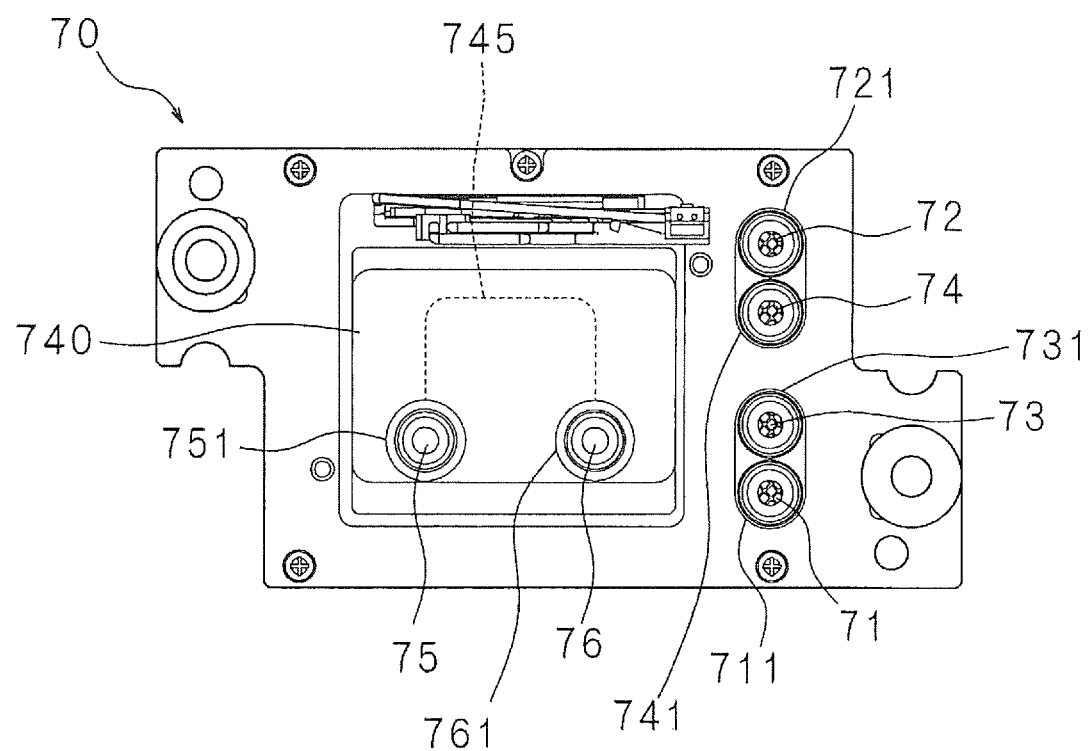
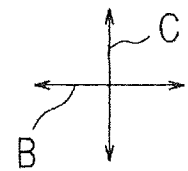

HEAD UNIT AND LIQUID EJECTION APPARATUS

CROSS REFERENCE TO RELATED APPLICATION

The present application claims priority from Japanese Patent Application No. 2017-192088, which was filed on Sep. 29, 2017, the disclosure of which is herein incorporated by reference in its entirety.

BACKGROUND

The following disclosure relates to a head unit and a liquid ejection apparatus.

Ink-jet recording apparatuses include a liquid-passage tube for supplying ink from an ink tank to an ink ejector. For example, there is known an ink-jet recording apparatus in which, in order to introduce ink from an ink storage chamber to ink outlet tubes located on opposite sides of the ink storage chamber, a liquid passage is branched off by forming (i) a flow-out opening at the center of the ink storage chamber and (ii) distribution grooves extending from the flow-out opening respectively toward opposite sides of the flow-out opening.

SUMMARY

In the case where the liquid passage is branched off, however, a branch component needs to be additionally provided to connect between liquid-passage tubes into which the liquid passage is branched. However, it is difficult to arrange not only the liquid-passage tubes but also the branch component in a small space such as the inside of the ink-jet recording apparatus. If the branch component is provided, the size of the ink-jet recording apparatus is increased unfortunately. Also, if the branch component is provided in a limited space, the flexibility of arrangement of the liquid-passage tubes is reduced.

Accordingly, an aspect of the disclosure relates to a head unit and a liquid ejection apparatus capable of arranging liquid-passage tubes in a limited space.

In one aspect of the disclosure, a head unit to be installed in a liquid ejection apparatus includes: a head module including a nozzle surface in which a plurality of nozzles are opened; a casing connected to the head module; a first connector connected to the liquid ejection apparatus and including a first communication opening communicating with a first communication liquid passage formed in the liquid ejection apparatus; a second connector connected to the liquid ejection apparatus and including a second communication opening communicating with a second communication liquid passage formed in the liquid ejection apparatus; a first liquid-passage tube disposed in the casing and fluidically connected to the first communication opening; a first branch-liquid-passage tube disposed in the casing and fluidically connected to the first liquid-passage tube; a second branch-liquid-passage tube disposed in the casing and fluidically connected to the first liquid-passage tube; a first tube joint disposed in the casing and connecting the first liquid-passage tube to the first branch-liquid-passage tube and the second branch-liquid-passage tube such that the first branch-liquid-passage tube and the second branch-liquid-passage tube branch off from the first liquid-passage tube; a second liquid-passage tube disposed in the casing and fluidically connected to the second communication opening; a third branch-liquid-passage tube disposed in the casing and fluidically connected to the second liquid-passage tube; a fourth branch-liquid-passage tube disposed in the casing and fluidically connected to the second liquid-passage tube; and a second tube joint disposed in the casing and connecting the second liquid-passage tube to the third branch-liquid-passage tube and the fourth branch-liquid-passage tube such that the third branch-liquid-passage tube and the fourth branch-liquid-passage tube branch off from the second liquid-passage tube, wherein the head module includes: a first liquid-passage opening fluidically connected to the first branch-liquid-passage tube; a second liquid-passage opening fluidically connected to the second branch-liquid-passage tube; a third liquid-passage opening fluidically connected to the third branch-liquid-passage tube; and a fourth liquid-passage opening fluidically connected to the fourth branch-liquid-passage tube, and wherein the first tube joint is disposed between the second connector and the second tube joint when viewed in a direction parallel with the nozzle surface.

In another aspect of the disclosure, a liquid ejection apparatus including a plurality of head units installed in the liquid ejection apparatus, the plurality of head units each including: a head module including a nozzle surface in which a plurality of nozzles are opened; a casing connected to the head module; a first connector connected to the liquid ejection apparatus and including a first communication opening communicating with a first communication liquid passage formed in the liquid ejection apparatus; a second connector connected to the liquid ejection apparatus and including a second communication opening communicating with a second communication liquid passage formed in the liquid ejection apparatus; a first liquid-passage tube disposed in the casing and fluidically connected to the first communication opening; a first branch-liquid-passage tube disposed in the casing and fluidically connected to the first liquid-passage tube; a second branch-liquid-passage tube disposed in the casing and fluidically connected to the first liquid-passage tube; a first tube joint disposed in the casing and connecting the first liquid-passage tube to the first branch-liquid-passage tube and the second branch-liquid-passage tube such that the first branch-liquid-passage tube and the second branch-liquid-passage tube branch off from the first liquid-passage tube; a second liquid-passage tube disposed in the casing and fluidically connected to the second communication opening; a third branch-liquid-passage tube disposed in the casing and fluidically connected to the second liquid-passage tube; a fourth branch-liquid-passage tube disposed in the casing and fluidically connected to the second liquid-passage tube; and a second tube joint disposed in the casing and connecting the second liquid-passage tube to the third branch-liquid-passage tube and the fourth branch-liquid-passage tube such that the third branch-liquid-passage tube and the fourth branch-liquid-passage tube branch off from the second liquid-passage tube, wherein the head module includes: a first liquid-passage opening fluidically connected to the first branch-liquid-passage tube; a second liquid-passage opening fluidically connected to the second branch-liquid-passage tube; a third liquid-passage opening fluidically connected to the third branch-liquid-passage tube; and a fourth liquid-passage opening fluidically connected to the fourth branch-liquid-passage tube, and wherein the first tube joint is disposed between the second connector and the second tube joint when viewed in a direction parallel with the nozzle surface.

BRIEF DESCRIPTION OF THE DRAWINGS

The objects, features, advantages, and technical and industrial significance of the present disclosure will be better understood by reading the following detailed description of the embodiment, when considered in connection with the accompanying drawings, in which:

FIG. 1 is a plan view of main components of an ink-jet printer according to the present embodiment;

FIG. 4 is a plan view of a head module in the present embodiment when the head module is viewed from a case side;

DETAILED DESCRIPTION OF THE EMBODIMENT

Figure 10:
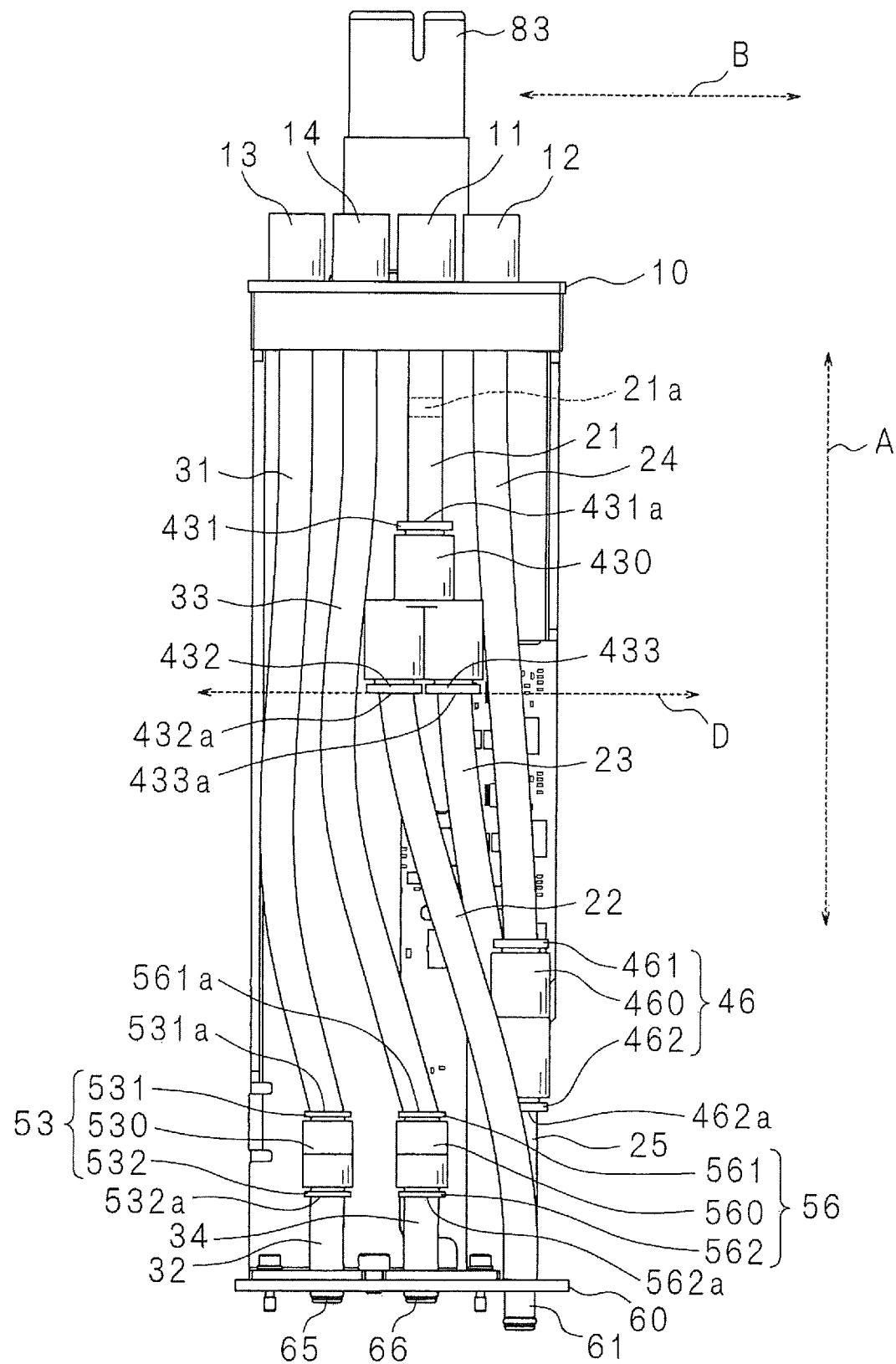
FIG. 10 is a front elevational view of the main components of the head unit in the present embodiment in the case where the casing is removed.

Hereinafter, there will be described one embodiment by reference to the drawings. It is to be understood that the following embodiment is described only by way of example, and the disclosure may be otherwise embodied with various modifications without departing from the scope and spirit of the disclosure. FIG. 1 illustrates an ink-jet printer 200 according to the present embodiment. It is noted that a direction A (as one example of a direction perpendicular to a nozzle surface), a direction B, a direction C, and a direction D are used in the present specification and drawings. The directions A-C are orthogonal to each other, and the direction D is indicated in FIG. 10, for example. The ink-jet printer 200 is one example of a liquid ejection apparatus. The ink-jet printer 200 includes: a housing 220; a platen 202 disposed in the housing 220; four ink-jet heads 203; two rollers 204; and a controller 205. It is noted that the numbers of the ink-jet heads 203 and the rollers 204 are not limited to those in FIG. 1.

The platen 202 supports recording sheets 201 to be used in the ink-jet printer 200. The rollers 204 are disposed on opposite ends of the platen 202 in the direction C. Rotation of the rollers 204 conveys each of the recording sheets 201 in the direction C.

The ink-jet heads 203 are arranged so as to be opposed to the platen 202 such that the outer shape of each of the ink-jet heads 203 is a rectangular shape in plan view. Specifically, the ink-jet heads 203 are arranged in a state in which the short sides of the rectangular shape of the ink-jet head 203 extend in a conveying direction in which the recording sheet 201 is conveyed (i.e., the direction C), and the long sides of the rectangular shape of the ink-jet head 203 extend in a direction (i.e., the direction B) orthogonal to the conveying direction. The ink-jet heads 203 are arranged between the two rollers 204 such that one of long-side surfaces of each of the ink-jet heads 203 is opposed to one of long-side surfaces of a corresponding adjacent one of the ink-jet heads 203 at an appropriate distance. It is noted that the direction B coincides with the longitudinal direction of a nozzle plate 780 which will be described below, and the direction C coincides with the widthwise direction of the nozzle plate 780.

The four ink-jet heads 203 respectively correspond to cyan, magenta, yellow, and black, for example.

The controller 205 includes a field-programmable gate array (FPGA), a read only memory (ROM), a random access memory (RAM), and an electrically erasable programmable read-only memory (EEPROM), which are not illustrated. The controller 205 is capable of performing mutual communication with external devices such as personal computers. When instructed from the external device or an operation device, not illustrated, of the ink-jet printer 200, the controller 205 controls operations of the ink-jet heads 203 and the rollers 204 according to programs stored in the ROM. It is noted that a central processing unit (CPU) or a microprocessor unit (MPU) may be used instead of the FPGA.

The controller 205 operates a motor, not illustrated, to control operations of the rollers 204 to convey the recording sheet 201. During conveyance of the recording sheet 201, the controller 205 controls the ink-jet heads 203 to eject ink onto the recording sheet 201.

Figure 2:
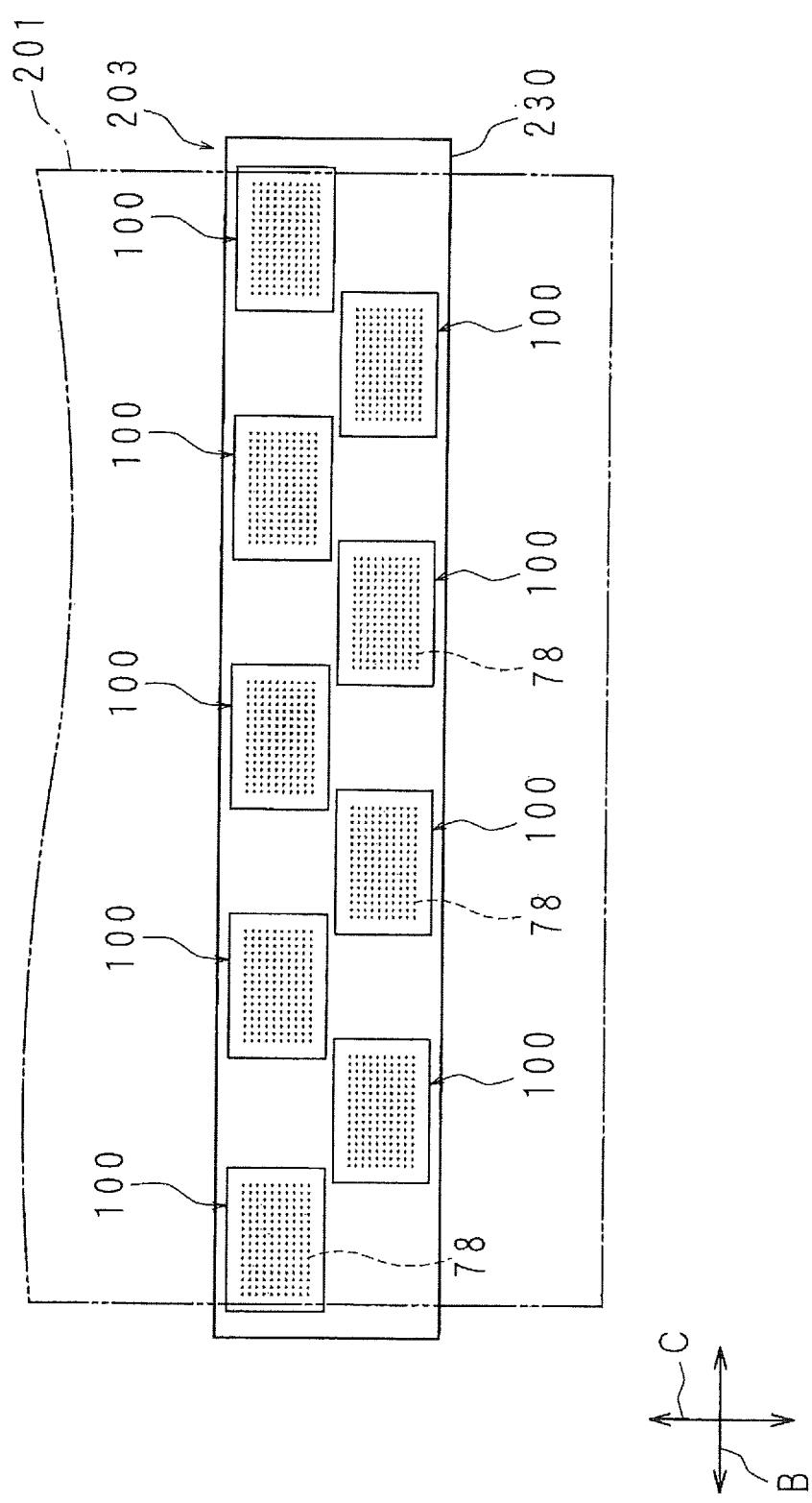
FIG. 2 is a plan view of main components of an ink-jet head in the present embodiment when the ink-jet head is viewed from a nozzle-surface side.

As illustrated in FIG. 2, each of the ink-jet heads 203 includes: a support plate 230 having a rectangular shape in plan view; and a plurality of head units 100 held by the support plate 230 by being respectively fitted in openings formed in the support plate 230. The support plate 230 holds a portion of each of the head units 100 which is near its nozzle surface. While each of the ink-jet heads 203 includes the nine head units 100 in the example in FIG. 2, the number of the head units 100 is not limited to nine.

The head units 100 are arranged in two rows that are arranged in the direction C. Four of the head units 100 are arranged in the direction B in one of the rows, and the other five head units 100 are arranged in the direction B in the other of the rows. It is noted that, since the head units 100 have the same configuration, the following description will be provided for one of the head units 100 for simplicity unless otherwise required, and likewise the following description will be provided for one of the ink-jet heads 203 for simplicity unless otherwise required. The nozzle surface of the head unit 100 has ejection openings 78 of a multiplicity of nozzles (openings). It is noted that the ejection openings 78 of the nozzles are schematically illustrated for easy understanding, and the arrangement and the number of the ejection openings 78 in the drawings are different from those of the ejection openings 78 in reality. The nozzle surface will be described below.

The ink-jet head 203 includes a holder, not illustrated, opposed to the support plate 230. The holder holds a portion of the head unit 100 which is far from the nozzle surface.

The ink-jet head 203 is provided with a reservoir, not illustrated, for storing the ink. The reservoir is located outside the holder and connected to an ink cartridge, not illustrated. The reservoir receives the ink from the ink cartridge and stores a particular amount of the ink. The reservoir supplies the ink to the head unit 100 via a plurality of communication liquid passages.

Figure 3:
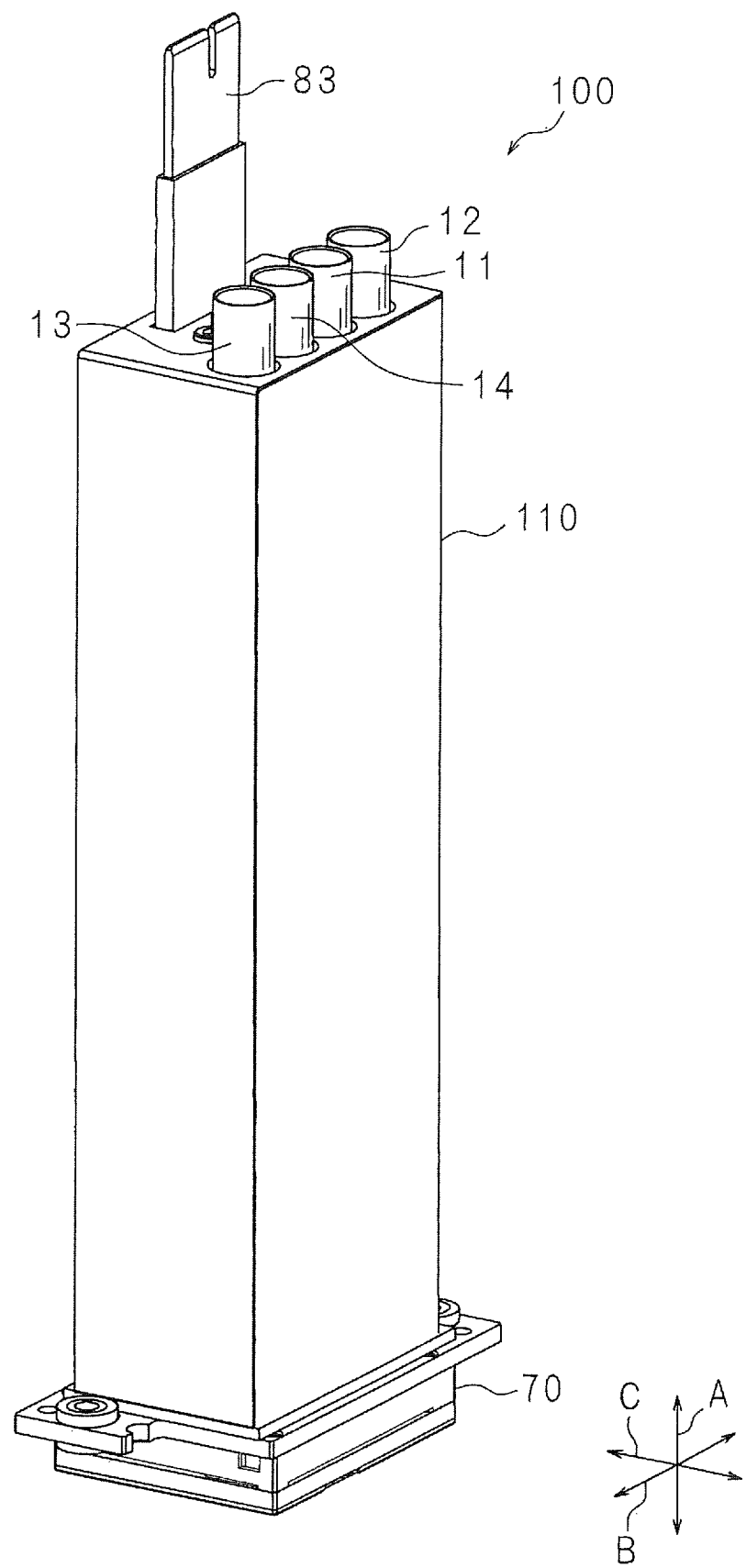
FIG. 3 is an external perspective view of a head unit according to the present embodiment.

The head unit 100 is mounted on a body of the ink-jet head 203. The head unit 100 is mountable on and removable from the ink-jet head 203. That is, the head unit 100 is mountable on and removable from the ink-jet printer 200. As illustrated in FIG. 3, the head unit 100 includes: a head module 70 having the nozzle surface formed with the ejection openings 78 of the respective nozzles; and a casing 110 connected to the head module 70.

As illustrated in FIG. 4, a liquid-passage opening 71 is an opening of a liquid passage which is formed in a bottom surface of a recessed portion 711 formed in the head module 70. A liquid-passage opening 72 is an opening of a liquid passage which is formed in a bottom surface of a recessed portion 721 formed in the head module 70. A liquid-passage opening 73 is an opening of a liquid passage which is formed in a bottom surface of a recessed portion 731 formed in the head module 70. A liquid-passage opening 74 is an opening of a liquid passage which is formed in a bottom surface of a recessed portion 741 formed in the head module 70. A liquid-passage opening 75 is an opening of a liquid passage which is formed in a bottom surface of a recessed portion 751 formed in the head module 70. A liquid-passage opening 76 is an opening of a liquid passage which is formed in a bottom surface of a recessed portion 761 formed in the head module 70. Each of the recessed portions 711, 721, 731, 741, 751, 761 of the head module 70 functions as a receptacle in which a corresponding one of bottom connectors, which will be described below, is fitted.

Figure 5:
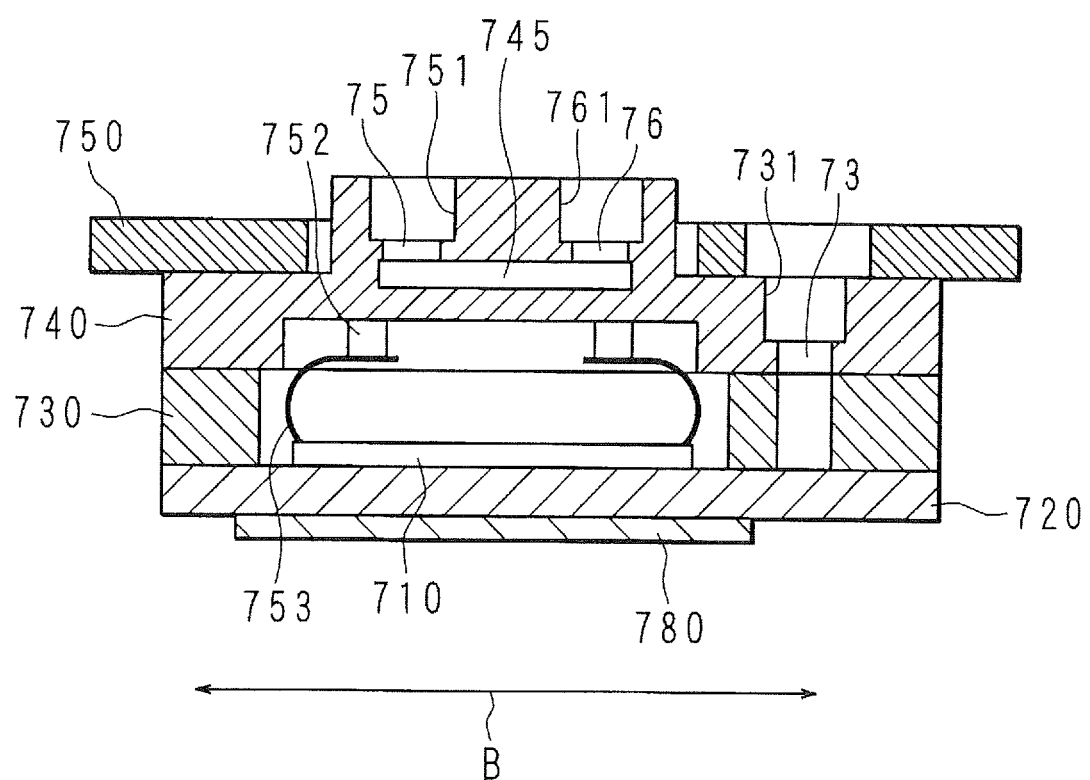
FIG. 5 is a cross-sectional view of a main portion of the head module in the present embodiment.

As illustrated in FIG. 5, the head module 70 includes the nozzle plate 780, a liquid-passage defining member 720, a frame 730, a cooling-liquid-passage defining member 740, and a fastening frame 750 stacked on one another in this order. Each of the frame 730, the cooling-liquid-passage defining member 740, and the fastening frame 750 has a liquid passage for introducing the ink to the liquid-passage defining member 720 and for returning the ink from the liquid-passage defining member 720 back to the reservoir, not illustrated. FIG. 5 illustrates the recessed portion 731 and the liquid-passage opening 73 for easy understanding.

The cooling-liquid-passage defining member 740 has: the recessed portions 751, 761 and the liquid-passage openings 75, 76 for circulation of cooling liquid; and a cooling liquid passage 745 establishing communication between the liquid-passage opening 75 and the liquid-passage opening 76.

A driver IC 752 is fixed to the cooling-liquid-passage defining member 740. An actuator 710 is fixed to an upper surface of the liquid-passage defining member 720. A COF (Chip On Film) 753 connecting the actuator 710 and the driver IC 752 to each other is disposed in a spaced formed in the frame 730.

Figure 6:
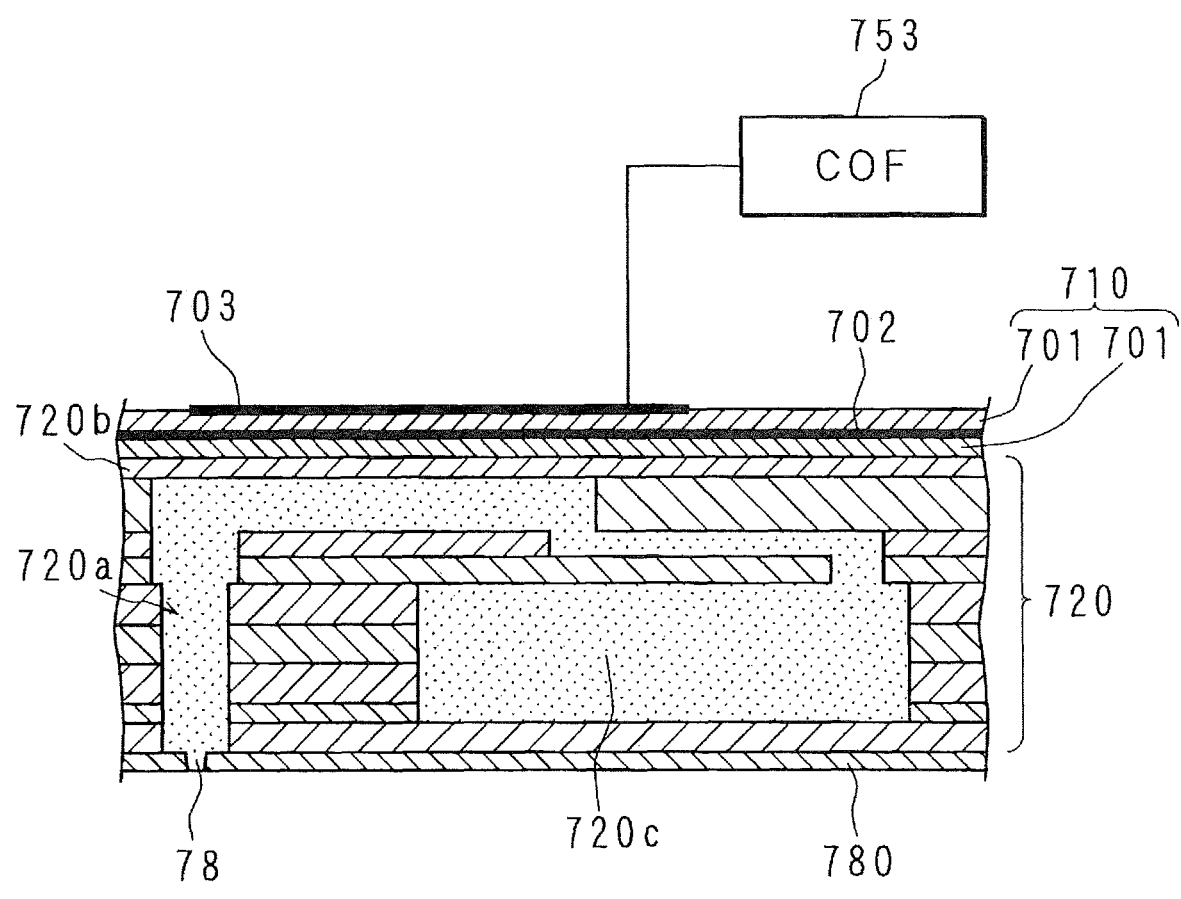
FIG. 6 is a cross-sectional view of a main portion of a liquid-passage defining member of the head module in the present embodiment.

As illustrated in FIG. 6, a lower surface of the nozzle plate 780 serves as the nozzle surface. The nozzle plate 780 has the ejection openings 78 of the respective nozzles. The nozzle plate 780 is formed of stainless steel, for example, but the present disclosure is not limited to this configuration. For example, the nozzle plate 780 may be formed of silicon, glass, ceramic, or a resin material. It is noted that the nozzle plate 780 partly constitutes the liquid-passage defining member 720.

The liquid-passage defining member 720 includes a plurality of metal plates stacked on one another in the up and down direction. The liquid-passage defining member 720 is formed of stainless steel, for example, but the present disclosure is not limited to this configuration. For example, the liquid-passage defining member 720 may be formed of silicon, glass, ceramic, or a resin material. The liquid-passage defining member 720 includes a vibration plate 720b elongated in the right and left direction and opposed to the nozzle plate 780. Pressure chambers 720a are formed just above the respective ejection openings 78 of the nozzles. The pressure chambers 720a communicate with a common liquid passage 720c. The vibration plate 720b is provided over the pressure chambers 720a so as to close openings of upper portions of the respective pressure chambers 720a.

The actuator 710 is disposed over the vibration plate 720b. The actuator 710 includes two piezoelectric layers 701 and a common electrode 702 sandwiched between the piezoelectric layers 701. The common electrode 702 is kept at ground potential. The actuator 710 includes a plurality of individual electrodes 703 arranged in the right and left direction. The individual electrodes 703 are provided on the upper piezoelectric layer 701 so as to be located just above the respective pressure chambers 720a.

The COF 753 having flexibility is shaped like a sheet and placed on an upper surface of the actuator 710. Control signals output from the controller 205 are input to the driver IC 752 via the COF 753 and a flexible printed circuit (FPC), and the driver IC 752 outputs drive signals to the actuator 710 based on the control signals.

When the drive signals are input to the actuator 710, the ink is ejected from the ejection openings 78 of the nozzles.

Figure 7:
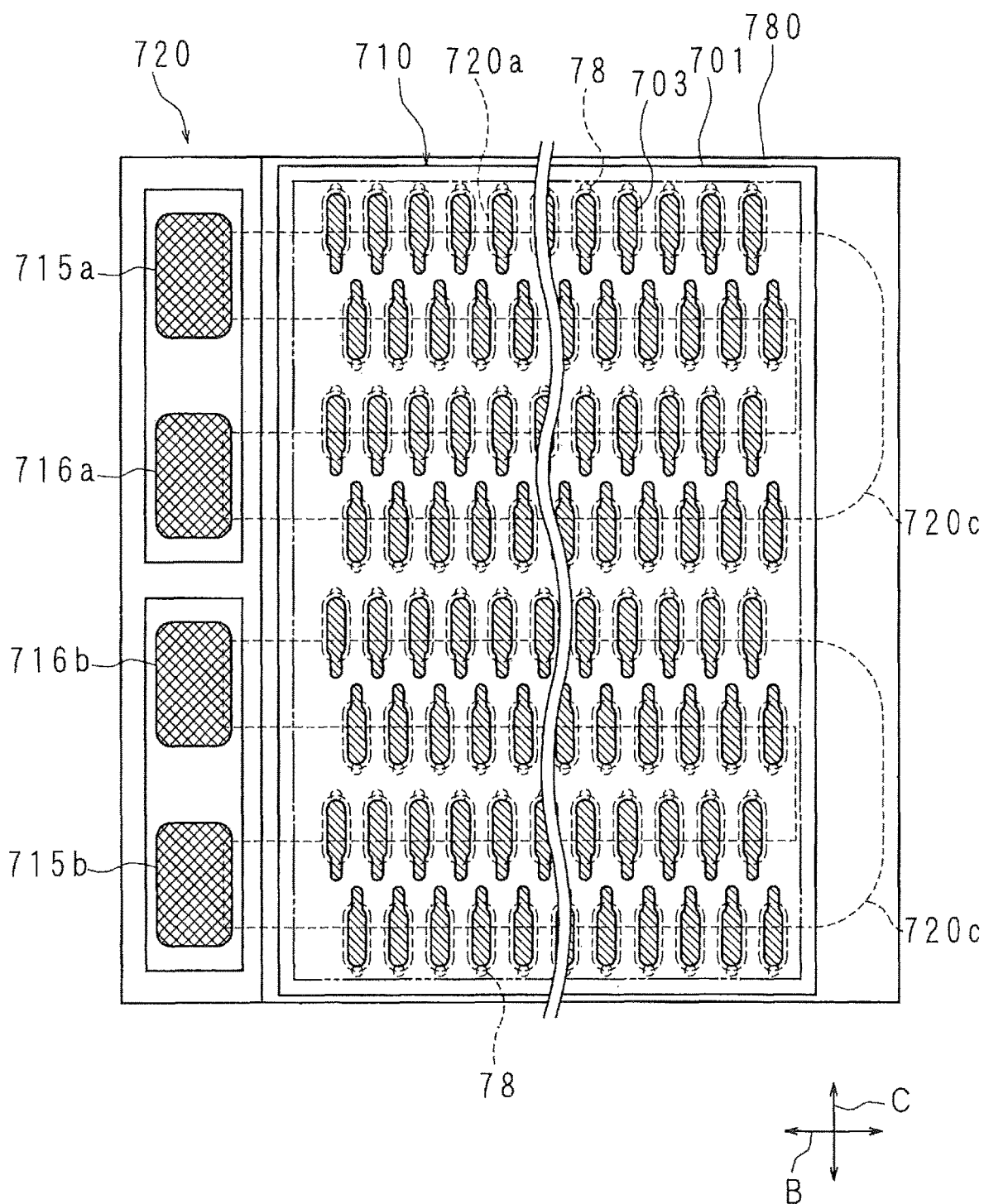
FIG. 7 is a schematic plan view of the liquid-passage defining member of the head module in the present embodiment.

As illustrated in FIG. 7, the liquid-passage defining member 720 has two supply openings 715a, 715b to which liquid (the ink) is to be supplied. The supply opening 715a communicates with the liquid-passage opening 72, and the supply opening 715b communicates with the liquid-passage opening 71. The two supply openings 715a, 715b are arranged in the direction C at a right edge portion of the liquid-passage defining member 720. Two output openings 716a, 716b for discharge of the liquid are arranged in the direction C at the right edge portion of the liquid-passage defining member 720. The output opening 716a communicates with the liquid-passage opening 74, and the output opening 716b communicates with the liquid-passage opening 73.

The supply opening 715a and the output opening 716a are connected to each other by the common liquid passage 720c having a U-shape in plan view. The supply opening 715b and the output opening 716b are connected to each other by the common liquid passage 720c having the U-shape in plan view. The common liquid passage 720c is formed in the liquid-passage defining member 720 and communicates with the pressure chambers 720a.

The ink (the liquid) supplied to the supply opening 715a and the supply opening 715b via the liquid-passage opening 72 and the liquid-passage opening 71 is transferred to the pressure chambers 720a through a common passage 717.

It is noted that, while the liquid-passage defining member 720 has the common liquid passage 720c having the U-shape in plan view in the example in FIG. 7, the present disclosure is not limited to this configuration. For example, the liquid-passage defining member 720 may be constructed so as to have: two supply openings formed instead of the output openings 716a, 716b; and a liquid passage having an I-shape in plan view and extending from the four supply openings such that the liquid (the ink) is not circulated.

Heat is generated by components including: the piezoelectric layers 701 for ejecting the liquid from the ejection openings 78; and the driver IC 752 connected to the piezoelectric layers 701. This heat raises temperatures of components including the liquid-passage defining member 720 and the actuator 710. However, circulation of the cooling water in the cooling-liquid-passage defining member 740 cools the driver IC 752, the liquid-passage defining member 720, the actuator 710, and so on. The cooling water is circulated by a pump, not illustrated, provided in the ink-jet printer 200. For example, the cooling liquid is supplied from the liquid-passage opening 75 to the cooling-liquid-passage defining member 740 and circulated from the liquid-passage opening 76 toward the pump.

Figure 8:
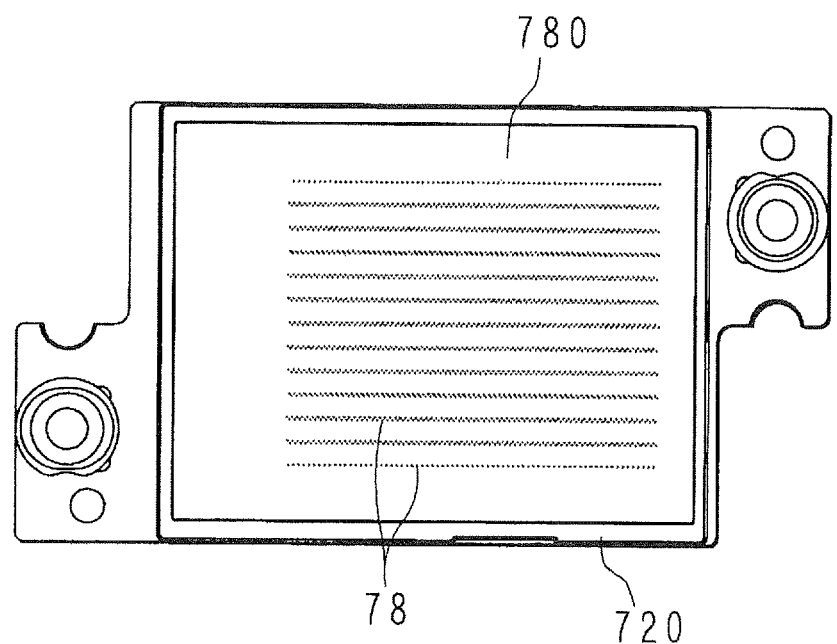
FIG. 8 is a plan view of the head module in the present embodiment when the head module is viewed from a nozzle-surface side.

As illustrated in FIG. 8, the nozzle plate 780 has the ejection openings 78 of the respective nozzles.

There will be next described the head unit 100 according to the present embodiment with reference to FIGS. 9-12.

The head unit 100 includes an elongated fastening plate 90. A top plate 10 is fastened to one of opposite ends of the fastening plate 90. A bottom plate 60 is fastened to the other of the opposite ends of the fastening plate 90. The bottom plate 60 is fastened to the head module 70. The fastening plate 90 has a main surface 901 parallel with the direction A and the direction B. The main surface 901 is elongated in the direction A. The fastening plate 90 has a bent portion 902 bent near one end of the main surface 901 in the up and down direction or a direction in which the nozzle plate 780 and the liquid-passage defining member 720 are stacked on each other. The fastening plate 90 has an extending portion 903 extending from the bent portion 902 in the direction C that coincides with the widthwise direction of the nozzle plate 780. The fastening plate 90 is screwed to the head module 70 at the extending portion 903.

Figure 12:
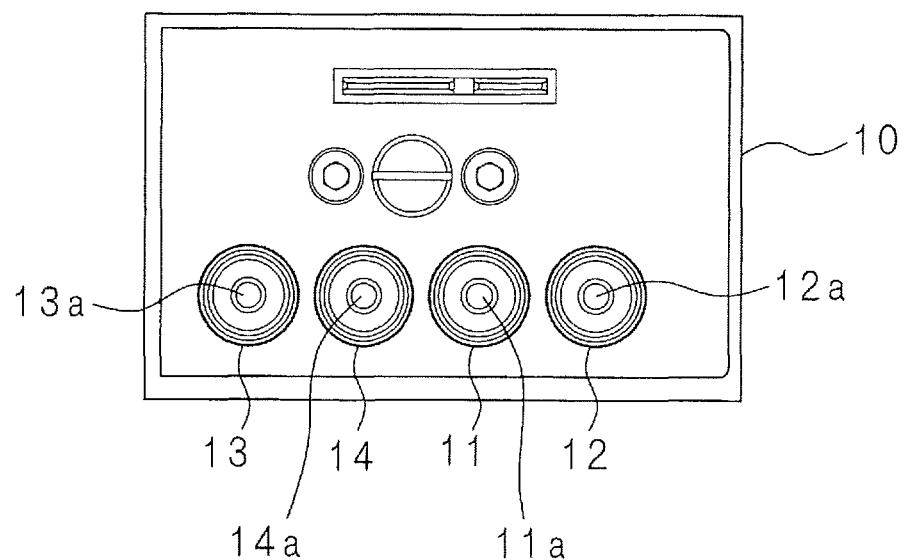
FIG. 12 is a plan view of the main components of the head unit in the present embodiment in the case where the casing is removed.

The top plate 10 is provided with (i) a connector 11 (as one example of a first connector) connected to the ink-jet printer 200 and having a communication opening 11a (as one example of a first communication opening) communicating with a communication liquid passage 241 (as one example of a first communication liquid passage) formed in the ink-jet printer 200, (ii) a connector 12 (as one example of a second connector) connected to the ink-jet printer 200 and having a communication opening 12a (as one example of a second communication opening) communicating with a communication liquid passage 242 (as one example of a second communication liquid passage) formed in the ink-jet printer 200, (iii) a connector 13 (as one example of a third connector) connected to the ink-jet printer 200 and having a communication opening 13a (as one example of a third communication opening) communicating with a communication liquid passage 243 (as one example of a third communication liquid passage) formed in the ink-jet printer 200, and (iv) a connector 14 (as one example of a fourth connector) connected to the ink-jet printer 200 and having a communication opening 14a (as one example of a fourth communication opening) communicating with a communication liquid passage 244 (as one example of a fourth communication liquid passage) formed in the ink-jet printer 200. It is noted that FIG. 12 illustrates the communication opening 11a, the communication opening 12a, the communication opening 13a, and the communication opening 14a.

The connector 11 is a receptacle connectable to a plug provided at a distal end of the communication liquid passage 241 of the ink-jet printer 200. A circular cylindrical liquid passage is formed in the receptacle, and an opening of this liquid passage near the ink-jet printer 200 is the communication opening 11a. A liquid-passage tube 21 (as one example of a first liquid-passage tube) is connected to a lower end of the connector 11.

The connector 12 is a receptacle connectable to a plug provided at a distal end of the communication liquid passage 242 of the ink-jet printer 200. A circular cylindrical liquid passage is formed in the receptacle, and an opening of this liquid passage near the ink-jet printer 200 is the communication opening 12a. A liquid-passage tube 24 (as one example of a second liquid-passage tube) is connected to a lower end of the connector 12.

The connector 13 is a receptacle connectable to a plug provided at a distal end of the communication liquid passage 243 of the ink-jet printer 200. A circular cylindrical liquid passage is formed in the receptacle, and an opening of this liquid passage near the ink-jet printer 200 is the communication opening 13a. A cooling tube 31 (as one example of a first cooling tube) is connected to a lower end of the connector 13.

The connector 14 is a receptacle connectable to a plug provided at a distal end of the communication liquid passage 244 of the ink-jet printer 200. A circular cylindrical liquid passage is formed in the receptacle, and an opening of this liquid passage near the ink-jet printer 200 is the communication opening 14a. A cooling tube 33 (as one example of a third cooling tube) is connected to a lower end of the connector 14.

The head unit 100 includes: the liquid-passage tube 21 fluidically connected to the communication opening 11a and contained in the casing 110; a branch-liquid-passage tube 22 (as one example of a first branch-liquid-passage tube) and a branch-liquid-passage tube 23 (as one example of a second branch-liquid-passage tube) fluidically connected to the liquid-passage tube 21 and contained in the casing 110; and a tube joint 43 (as one example of a first tube joint) contained in the casing 110 and connecting the liquid-passage tube 21 to each of the branch-liquid-passage tube 22 and the branch-liquid-passage tube 23 such that the branch-liquid-passage tube 22 and the branch-liquid-passage tube 23 branch off from the liquid-passage tube 21. Each of the liquid-passage tube 21, the branch-liquid-passage tube 22 and the branch-liquid-passage tube 23 is a resin tube for supplying the ink to the head module 70, for example.

The tube joint 43 includes three plugs 431, 432, 433 and a receptacle 430. The plug 431 has a connection opening 431a to which the liquid-passage tube 21 is connected. The plug 432 has a connection opening 432a (as one example of a first connection opening) to which the branch-liquid-passage tube 22 is connected. The plug 433 has a connection opening 433a (as one example of a second connection opening) to which the branch-liquid-passage tube 23 is connected. The connection opening 432a and the connection opening 433a are arranged next to each other in the second direction (i.e., the direction B in FIG. 10) parallel with the nozzle surface. The receptacle 430 has branch liquid passages therein and is connected to the plugs 431, 432, 433.

The head unit 100 includes: the liquid-passage tube 24 fluidically connected to the communication opening 12a and contained in the casing 110; a branch-liquid-passage tube 25 (as one example of a third branch-liquid-passage tube) and a branch-liquid-passage tube 26 (as one example of a fourth branch-liquid-passage tube) fluidically connected to the liquid-passage tube 24 and contained in the casing 110; and a tube joint 46 (as one example of a second tube joint) contained in the casing 110 and connecting the liquid-passage tube 24 to each other the branch-liquid-passage tube 25 and the branch-liquid-passage tube 26 such that the branch-liquid-passage tube 25 and the branch-liquid-passage tube 26 branch off from the liquid-passage tube 24. Each of the liquid-passage tube 24, the branch-liquid-passage tube 25, and the branch-liquid-passage tube 26 is a resin tube for transferring the ink from the head module 70 back to the reservoir, for example.

The tube joint 46 includes three plugs 461, 462, 463 and a receptacle 460. The plug 461 has a connection opening 461a to which the liquid-passage tube 24 is connected. The plug 462 has a connection opening 462a (as one example of a third connection opening) to which the branch-liquid-passage tube 25 is connected. The plug 463 has a connection opening 463a (as one example of a fourth liquid-passage opening) to which the branch-liquid-passage tube 26 is connected. The connection opening 462a and the connection opening 463a are arranged next to each other in the third direction (i.e., the direction C in FIG. 11) parallel with the nozzle surface. The receptacle 460 has branch liquid passages therein and is connected to the plugs 461, 462, 463.

The head unit 100 includes: the cooling tube 31 fluidically connected to the communication opening 13a and contained in the casing 110; a cooling tube 32 (as one example of a second cooling tube) fluidically connected to the cooling tube 31 and contained in the casing 110; and a tube joint 53 (as one example of a third tube joint) connecting the cooling tube 31 to the cooling tube 32 and contained in the casing 110.

The tube joint 53 includes two plugs 531, 532 and a receptacle 530. The plug 531 has a connection opening 531a to which the cooling tube 31 is connected. The plug 532 has a connection opening 532a to which the cooling tube 32 is connected. The receptacle 530 is connected to the plugs 531, 532.

The head unit 100 includes: the cooling tube 33 fluidically connected to the communication opening 14a and contained in the casing 110; a cooling tube 34 (as one example of a fourth cooling tube) fluidically connected to the cooling tube 33 and contained in the casing 110; and a tube joint 56 (as one example of a fourth tube joint) connecting the cooling tube 33 to the cooling tube 34 and contained in the casing 110.

The tube joint 56 includes two plugs 561, 562 and a receptacle 560. The plug 561 has a connection opening 561a to which the cooling tube 33 is connected. The plug 562 has a connection opening 562a to which the cooling tube 34 is connected. The receptacle 560 is connected to the plugs 561, 562. Each of the cooling tubes 31-34 is a resin tube.

Since the ink flows in the liquid-passage tube 21, the branch-liquid-passage tube 22, the branch-liquid-passage tube 23, the liquid-passage tube 24, the branch-liquid-passage tube 25, and the branch-liquid-passage tube 26, each of these tubes is formed of a chemical-resistant material, has relatively high hardness, and is hard to bend. Each of the cooling tube 31, the cooling tube 32, the cooling tube 33, and the cooling tube 34 may also be formed of a material having relatively high hardness in order to prevent unintentional removal of these tubes from the connectors or the joints.

The bottom plate 60 is provided with bottom connectors 61-66.

The bottom connector 61 is a receptacle secured to the bottom plate 60. One end of the bottom connector 61 is secured to the branch-liquid-passage tube 22. The bottom connector 61 has a through liquid passage connected to the liquid-passage opening 71 (as one example of a first liquid-passage opening) of the head module 70. The bottom connector 61 is connected to the recessed portion 711 (see FIG. 4).

The bottom connector 62 is a receptacle secured to the bottom plate 60. One end of the bottom connector 62 is secured to the branch-liquid-passage tube 23. The bottom connector 62 has a through liquid passage connected to the liquid-passage opening 72 (as one example of a second liquid-passage opening) of the head module 70. The bottom connector 62 is connected to the recessed portion 721.

The bottom connector 63 is a receptacle secured to the bottom plate 60. One end of the bottom connector 63 is secured to the branch-liquid-passage tube 25. The bottom connector 63 has a through liquid passage connected to the liquid-passage opening 73 (as one example of a third liquid-passage opening) of the head module 70. The bottom connector 63 is connected to the recessed portion 731.

The bottom connector 64 is a receptacle secured to the bottom plate 60. One end of the bottom connector 64 is secured to the branch-liquid-passage tube 26. The bottom connector 64 has a through liquid passage connected to the liquid-passage opening 74 (as one example of a fourth liquid-passage opening) of the head module 70. The bottom connector 64 is connected to the recessed portion 741.

The bottom connector 65 is a receptacle secured to the bottom plate 60. One end of the bottom connector 65 is secured to the cooling tube 32. The bottom connector 65 has a through liquid passage connected to the liquid-passage opening 75 (as one example of a fifth liquid-passage opening) of the head module 70. The bottom connector 65 is connected to the recessed portion 751.

The bottom connector 66 is a receptacle secured to the bottom plate 60. One end of the bottom connector 66 is secured to the cooling tube 34. The bottom connector 66 has a through liquid passage connected to the liquid-passage opening 76 (as one example of a sixth liquid-passage opening) of the head module 70. The bottom connector 66 is connected to the recessed portion 761.

Figure 14:
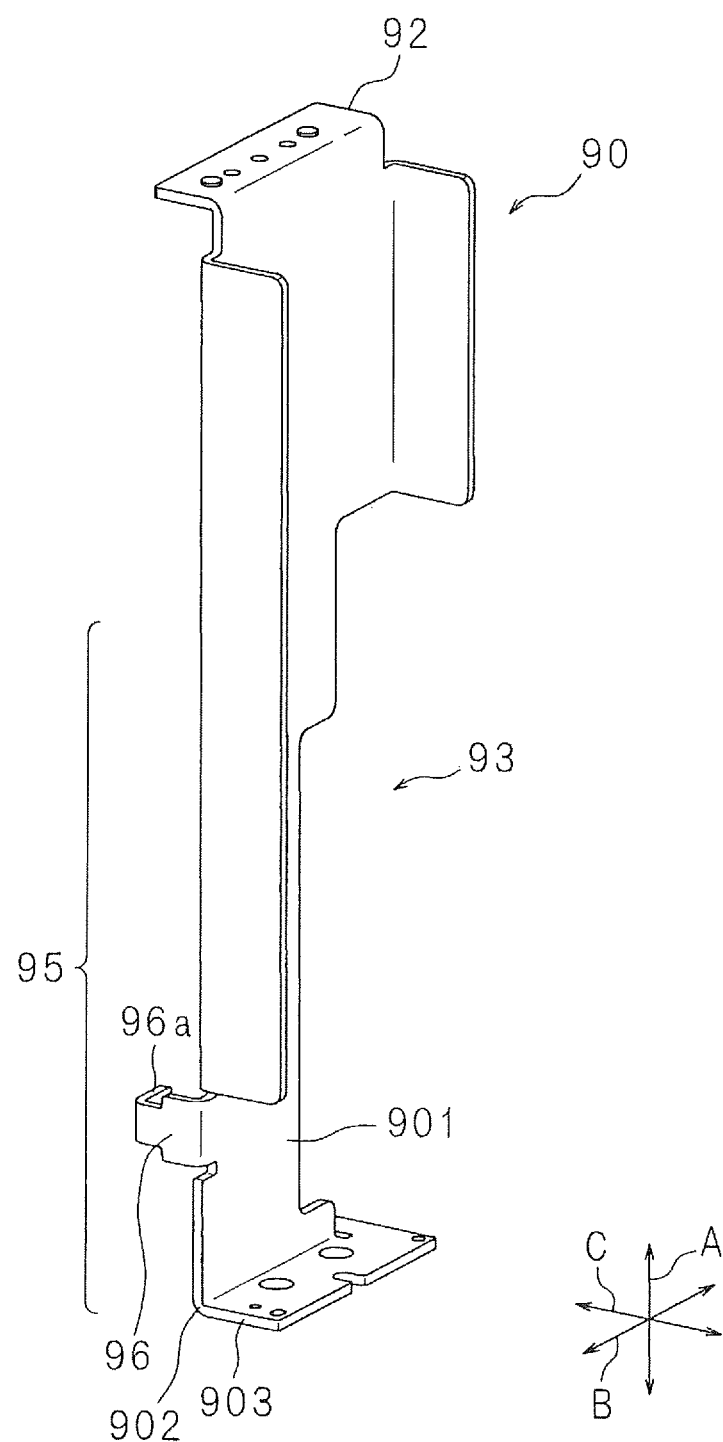
FIG. 14 is an external perspective view of a fastening plate in the present embodiment.

The head unit 100 includes an elongated circuit board 80. The dimension of the circuit board 80 in the direction A is substantially equal to that of the fastening plate 90 in the direction A. The dimension of the circuit board 80 in the direction B is substantially equal to that of the fastening plate 90 in the direction B. The fastening plate 90 has a fastening portion 96 bent in an L-shape from an edge portion of the fastening plate 90 in the direction B. The circuit board 80 may be fastened to the fastening portion 96 by a screw 97, for example. More specifically, as illustrated in FIG. 14, a screw hole is formed in a screw fastening portion 96a bent in the direction B from an end of the fastening portion 96, and a screw is engaged with this screw hole to fasten the circuit board 80 to the fastening plate 90.

As illustrated in FIG. 10, the tube joint 43 is disposed between the connector 12 and the tube joint 46 in the first direction (i.e., the direction A in FIG. 10) orthogonal to the nozzle surface. In other words, the tube joint 43 is disposed between the connector 12 and the tube joint 46 when viewed in the direction parallel with the nozzle surface (e.g., the direction B). In other words, in the case where it is assumed that the direction A coincides with the up and down direction, the tube joint 43 is located below the connector 12 and above the tube joint 46. That is, the tube joint 43 is disposed at a position lower in height than the position of the connector 12 and higher in height than the position of the tube joint 46. More specifically, an upper end of the tube joint 43 is located below a lower end of the connector 12, and a lower end of the tube joint 43 is located above an upper end of the tube joint 46. The tube joint 43 and the tube joint 46 are different in position from each other in the first direction so as not to interfere with each other. Thus, in the case where the tube joint 43 and the tube joint 46 are, for example, projected toward a surface of the bottom plate 60, even when a region occupied by the tube joint 43 on the surface and a region occupied by the tube joint 46 on the surface are made overlap each other, the tube joint 43 and the tube joint 46 can be disposed in the casing 110 so as not to interfere with each other, resulting in reduced size of a region occupied by the tube joint 43 and the tube joint 46 in the casing 110 as a whole. As a result, the tube joint 43, the tube joint 46, and the liquid-passage tubes (including the liquid-passage tube 21, the liquid-passage tube 24, the branch-liquid-passage tube 22, the branch-liquid-passage tube 23, the branch-liquid-passage tube 25, and the branch-liquid-passage tube 26, for example) can be arranged in a limited space.

Figure 11:
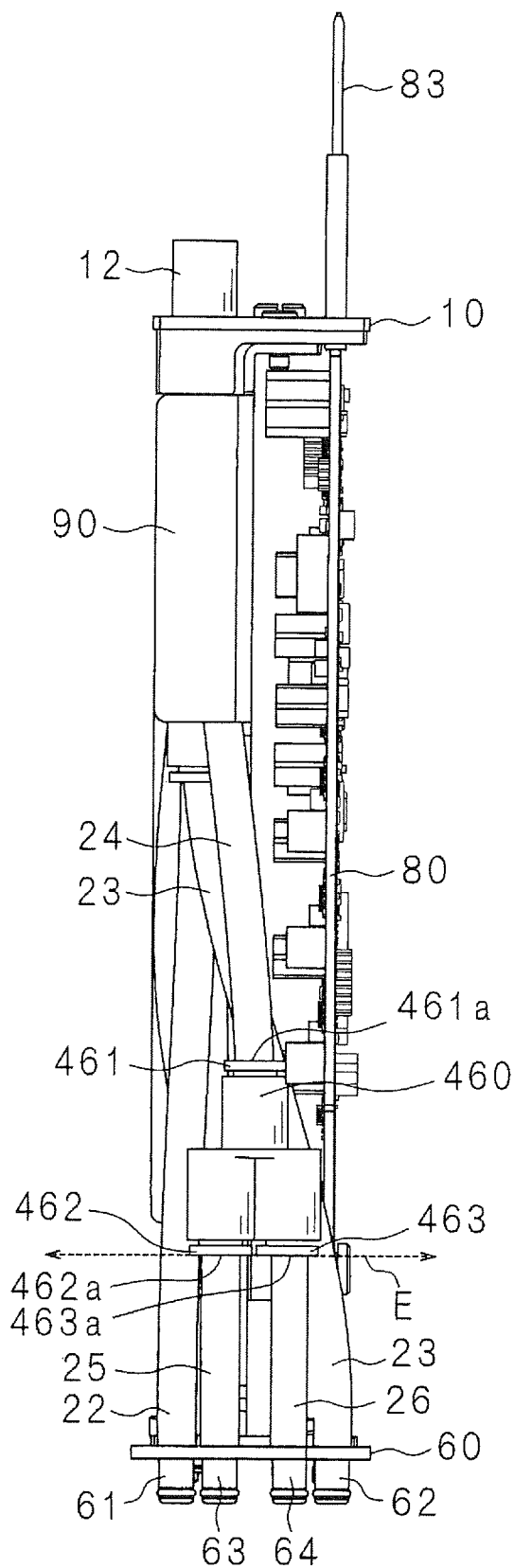
FIG. 11 is a side view of the main components of the head unit in the present embodiment in the case where the casing is removed.

As illustrated in FIGS. 10 and 11, the second direction (i.e., the direction D in FIG. 10) and the third direction (i.e., the direction E in FIG. 11) intersect each other at a particular angle. In other words, the connection opening 462a and the connection opening 463a are arranged next to each other in a direction parallel with the nozzle surface and intersecting the second direction (i.e., the direction D) in which the connection opening 432a and the connection opening 433a are arranged next to each other. In the example in FIGS. 10 and 11, the particular angle is 90 degrees but is not limited to 90 degrees. For example, the particular angle may be any of 60, 45, and 35 degrees, for example. In the tube joint 43, the connection opening 432a and the connection opening 433a for connecting the branch-liquid-passage tube 22 and the branch-liquid-passage tube 23 to each other are arranged in the second direction, resulting in a greater dimension of the outer shape of the tube joint 43 (which will be referred to as "width" for convenience) in the second direction. In the tube joint 46, likewise, the connection opening 462a and the connection opening 463a for connecting the branch-liquid-passage tube 25 and the branch-liquid-passage tube 26 to each other are arranged in the third direction, resulting in a greater dimension of the outer shape of the tube joint 46 (which will be referred to as "width" for convenience) in the third direction. If the direction in which the connection opening 432a and the connection opening 433a are arranged and the direction in which the connection opening 462a and the connection opening 463a are arranged are the same direction (in other words, the directions are parallel with each other), the dimension of the entirety of the tube joint 43 and the tube joint 46 in the same direction is large with respect to the inside space of the casing 110. In the present embodiment, in contrast, since the second direction and the third direction intersect each other at the particular angle, the widthwise directions of the tube joint 43 and the tube joint 46 are different from each other on a plane, resulting in reduced size of the entirety of the tube joint 43 and the tube joint 46 with respect to the inside space of the casing 110. It is noted that the particular angle is preferably 90 degrees. It is noted that the direction D is parallel with the direction B in the example in FIG. 10 but need not be parallel with the direction B. Also, the direction E is parallel with the direction C in the example in FIG. 11 but need not be parallel with the direction C.

As illustrated in FIG. 4, the liquid-passage opening 71, the liquid-passage opening 73, the liquid-passage opening 74, and the liquid-passage opening 72 are arranged in this order in the fourth direction (i.e., the direction C in FIG. 4) parallel with the nozzle surface. As a result, the branch-liquid-passage tube 25 and the branch-liquid-passage tube 26, into which the liquid-passage tube 24 is branched by the tube joint 46, can be arranged substantially vertically respectively from the connection opening 462a and the connection opening 463a (see FIG. 11), resulting in reduced stress (e.g., bending stress) on the branch-liquid-passage tube 25 and the branch-liquid-passage tube 26.

The distance between the connection opening 462a and the connection opening 463a may be substantially equal to the distance between the liquid-passage opening 73 and the liquid-passage opening 74. The wordings "substantially equal to" means that a difference between these distances may be within 30 percent of the outside diameter of each of the branch-liquid-passage tube 25 and the branch-liquid-passage tube 26, for example. As a result, the branch-liquid-passage tube 25 and the branch-liquid-passage tube 26 can be arranged substantially vertically respectively from the connection opening 462a and the connection opening 463a (see FIG. 11), resulting in reduced stress (e.g., bending stress) on the branch-liquid-passage tube 25 and the branch-liquid-passage tube 26.

The length of the liquid-passage tube 21 is substantially equal to the length of each of the branch-liquid-passage tube 25 and the branch-liquid-passage tube 26. The wordings "substantially equal to" means that a difference between these lengths may be within 10 percent of the length of the liquid-passage tube 21, for example. Thus, the same components may be used for the liquid-passage tube 21, the branch-liquid-passage tube 25, and the branch-liquid-passage tube 26, resulting in reduction in the number of components.

The length of the liquid-passage tube 24 is substantially equal to that of each of the branch-liquid-passage tube 22 and the branch-liquid-passage tube 23. The wordings "substantially equal to" means that a difference between these lengths may be within 10 percent of the length of the liquid-passage tube 24, for example. Thus, the same components may be used for the liquid-passage tube 24, the branch-liquid-passage tube 22, and the branch-liquid-passage tube 23, resulting in reduction in the number of components.

The length of each of the branch-liquid-passage tube 22 and the branch-liquid-passage tube 23 is greater than that of the liquid-passage tube 21. This makes it easy to bend the branch-liquid-passage tube 22 and the branch-liquid-passage tube 23 when arranging these tubes, that is, the flexibility of the branch-liquid-passage tube 22 and the branch-liquid-passage tube 23 is increased, resulting in increase in flexibility in arrangement of the tubes.

The length of the liquid-passage tube 24 is greater than that of each of the branch-liquid-passage tube 25 and the branch-liquid-passage tube 26. This makes it easy to bend the liquid-passage tube 24 when arranging the liquid-passage tube 24, that is, the flexibility of the liquid-passage tube 24 is ensured, resulting in increase in flexibility in arrangement of the liquid-passage tube 24.

As illustrated in FIG. 10, the connector 11 is nearer to the center of the top plate 10 than the connector 12 in a fifth direction (i.e., the direction B in FIG. 10) orthogonal to the fourth direction (i.e., the direction C in FIG. 4). That is, the connector 11 is nearer to the center of the top plate 10 than the connector 12 in a direction orthogonal to the direction in which the liquid-passage opening 71, the liquid-passage opening 73, the liquid-passage opening 74, and the liquid-passage opening 72 are arranged. With this configuration, the tube joint 43 can be disposed in the casing 110 without interfering with an inner surface of the casing 110.

As illustrated in FIG. 10, a filter 21a is provided in the liquid-passage tube 21. The filter 21a is nearer to the head module 70 than a portion of the liquid-passage tube 21 which is connected to the connector 11. This configuration can reduce fine dust or foreign matters mixed in the ink, to prevent the dust or foreign matters from flowing into the head module 70. Also, the position of the filter 21a is made close to the connector 11, thereby ensuring the flexibility of the liquid-passage tube 21.

As illustrated in FIG. 10, the tube joint 53 and the tube joint 56 are disposed between the tube joint 43 and the head module 70 in the first direction (i.e., the direction A in FIG. 10). The tube joint 43, and the tube joint 53 and the tube joint 56 are different in position from each other in the first direction so as not to interfere with each other. Thus, in the case where the tube joint 43, and the tube joint 53 and the tube joint 56 are, for example, projected toward the surface of the bottom plate 60, even when the region occupied by the tube joint 43 on the surface and a region occupied by the tube joint 53 and the tube joint 56 on the surface are made overlap each other, the tube joint 43, and the tube joint 53 and the tube joint 56 can be disposed in the casing 110 so as not to interfere with each other, resulting in reduced size of a region occupied by the tube joint 43, the tube joint 53, and the tube joint 56 in the casing 110 as a whole. As a result, the tube joint 43, the tube joint 53, the tube joint 56, the cooling tube 31, the cooling tube 32, the cooling tube 33, and the cooling tube 34 can be arranged in a limited space.

The length of each of the cooling tube 31 and the cooling tube 33 is greater than that of each of the cooling tube 32 and the cooling tube 34. This makes it easy to bend the cooling tube 31 and the cooling tube 33 when arranging these tubes, that is, the flexibility of the cooling tube 31 and the cooling tube 33 is increased, resulting in increase in flexibility in arrangement of the tubes.

Figure 9:
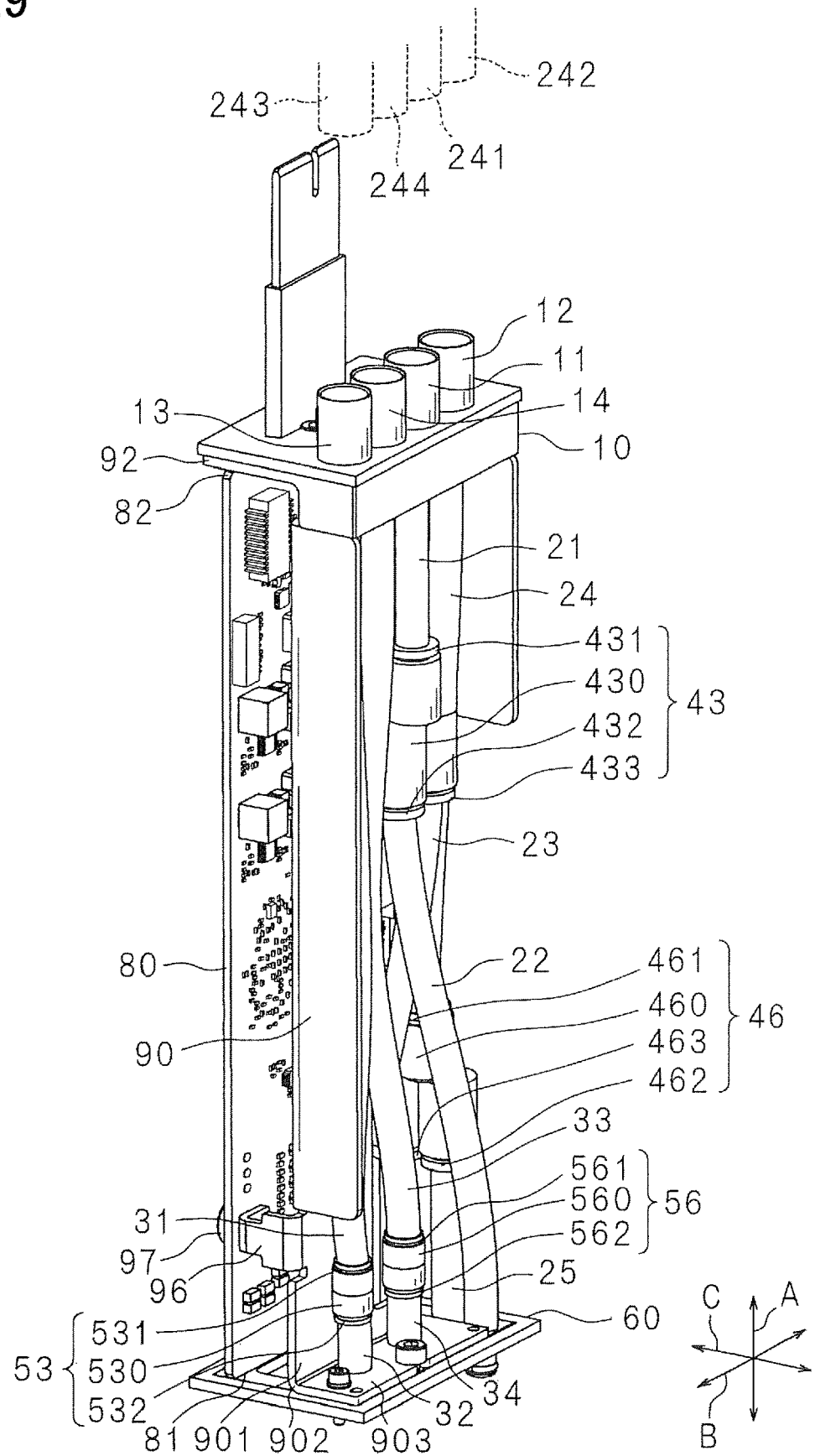
FIG. 9 is an external perspective view of main components of the head unit in the present embodiment in the case where the casing is removed.
Figure 13:
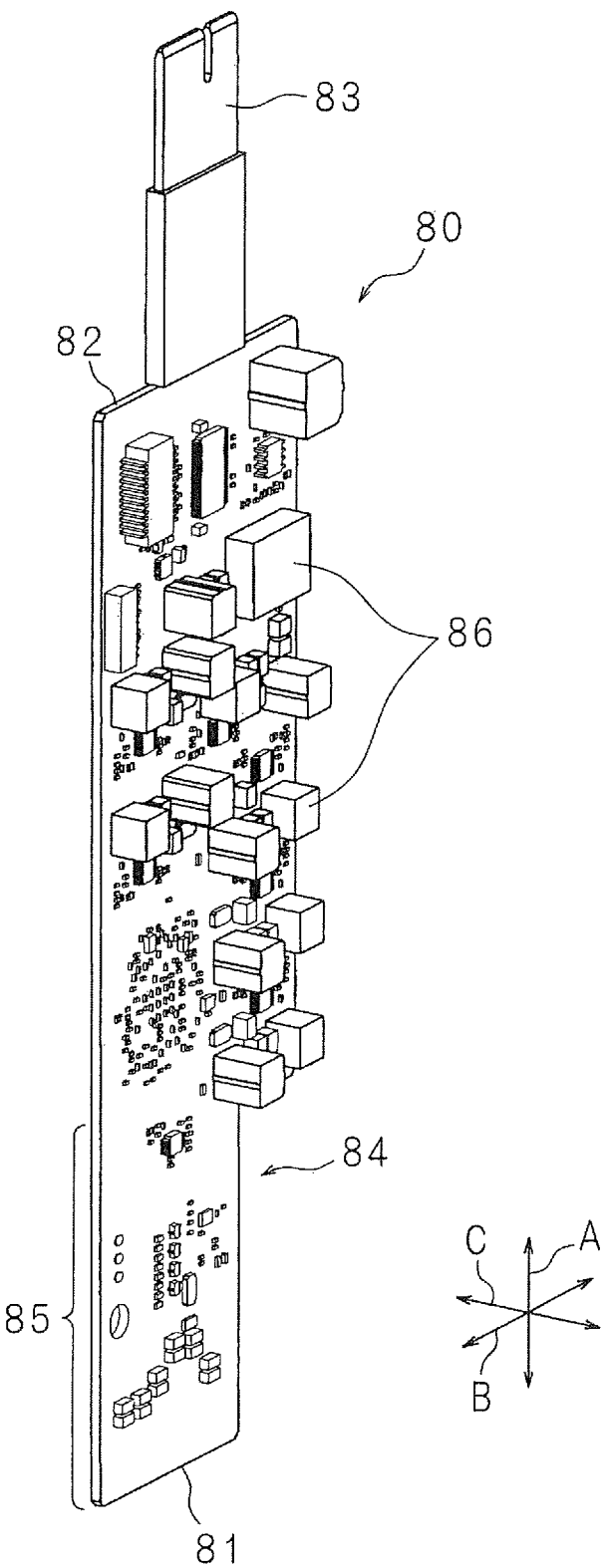
FIG. 13 is an external perspective view of a circuit board in the present embodiment.

As illustrated in FIGS. 9 and 13, components 86, such as a plurality of power supply circuits and FPGAs, are mounted on the circuit board 80. The circuit board 80 has an end 81 (as one example of a first end) and an end 82 (as one example of a second end) in the direction A (as one example of a direction orthogonal to the nozzle surface). The end 81 is nearer to the head module 70 than the end 82 in the direction A, and the end 82 is nearer to the connector 11 and the connector 12 than the end 81 in the direction A. The circuit board 80 includes a connector 83 protruding from the end 82. The connector 83 is electrically connected to a connector, not illustrated. The circuit board 80 has a cutout portion 84 near the end 81. The cutout portion 84 is formed by cutting out a portion of one of edge portions of the circuit board 80 in the direction B (as one example of the direction parallel with the nozzle surface). The cutout portion 84 defines a board narrow portion 85 of the circuit board 80 near the end 81. Providing the board narrow portion 85, i.e., the cutout portion 84, can form a space for arrangement of the liquid-passage tubes and so on in the casing 110, without interfering with the circuit board 80.

As illustrated in FIGS. 10 and 11, a portion of the tube joint 46 is disposed in the cutout portion 84 of the circuit board 80, i.e., a space defined by the cutout portion 84. This configuration prevents interference between the tube joint 46 and the circuit board 80 while forming the space for the tube joint 46.

As illustrated in FIGS. 10 and 11, the board narrow portion 85 may be disposed so as to intersect at least one of the branch-liquid-passage tube 22, the branch-liquid-passage tube 23, the branch-liquid-passage tube 25, and the branch-liquid-passage tube 26. In other words, when viewed in the direction parallel with the nozzle surface (e.g., the direction B), the board narrow portion 85 overlaps at least one of the branch-liquid-passage tube 22, the branch-liquid-passage tube 23, the branch-liquid-passage tube 25, and the branch-liquid-passage tube 26. This configuration prevents interference of the branch-liquid-passage tube 22, the branch-liquid-passage tube 23, the branch-liquid-passage tube 25, and the branch-liquid-passage tube 26 with the circuit board 80 while forming a space for arrangement of the branch-liquid-passage tube 22, the branch-liquid-passage tube 23, the branch-liquid-passage tube 25, and the branch-liquid-passage tube 26.

As illustrated in FIGS. 9, 11, and 14, the fastening plate 90 is disposed between the circuit board 80 and the tube joint 43. The fastening plate 90 has the extending portion 903 (as one example of a first end) and an end 92 (as one example of a second end) as opposite ends of the fastening plate 90 in the direction A (as one example of the direction orthogonal to the nozzle surface). The extending portion 903 is nearer to the head module 70 than the end 92 in the direction A. The end 92 is nearer to the connector 11 and the connector 12 than the extending portion 903 in the direction A. The fastening plate 90 has a cutout portion 93 near the extending portion 903. The cutout portion 93 is formed by cutting out a portion of one of edge portions of the fastening plate 90 in the direction B (as one example of the direction parallel with the nozzle surface). The cutout portion 93 forms a fastening-plate narrow portion 95 of the fastening plate 90 near the extending portion 903. Providing the fastening-plate narrow portion 95, i.e., the cutout portion 93, can form a space for arrangement of the liquid-passage tubes and so on in the casing 110, without interfering with the fastening plate 90.

The fastening-plate narrow portion 95 may be disposed so as to intersect at least one of the branch-liquid-passage tube 22, the branch-liquid-passage tube 23, the branch-liquid-passage tube 25, and the branch-liquid-passage tube 26. In other words, when viewed in the direction parallel with the nozzle surface (e.g., the direction B), the fastening-plate narrow portion 95 overlaps at least one of the branch-liquid-passage tube 22, the branch-liquid-passage tube 23, the branch-liquid-passage tube 25, and the branch-liquid-passage tube 26. This configuration prevents interference of the branch-liquid-passage tube 22, the branch-liquid-passage tube 23, the branch-liquid-passage tube 25, and the branch-liquid-passage tube 26 with the fastening plate 90 while forming a space for arrangement of the branch-liquid-passage tube 22, the branch-liquid-passage tube 23, the branch-liquid-passage tube 25, and the branch-liquid-passage tube 26.

The cutout portion 93 of the fastening plate 90 extends along the longitudinal direction of each of the branch-liquid-passage tube 22 and the branch-liquid-passage tube 23. This configuration, as illustrated in FIG. 11, facilitates arrangement of the branch-liquid-passage tube 23 connected to the bottom connector 62. Also, it is possible to form a space for arrangement of the tube joint 46, the branch-liquid-passage tube 25, and the branch-liquid-passage tube 26.

In the present embodiment, it is possible to arrange the liquid-passage tubes and the tube joints in a small space in the casing 110 as described above.

In the present embodiment, the liquid-passage tube 21, the branch-liquid-passage tube 22, and the branch-liquid-passage tube 23 are the liquid-passage tubes for supplying the ink to the head module 70, and the liquid-passage tube 24, the branch-liquid-passage tube 25, and the branch-liquid-passage tube 26 are the liquid-passage tubes for returning the ink from the head module 70 to the reservoir. However, the present disclosure is not limited to this configuration. The present disclosure may be applied to a head unit configured such that the ink is not circulated in the head module 70. In this case, the liquid-passage tube 21, the branch-liquid-passage tube 22, the branch-liquid-passage tube 23, the liquid-passage tube 24, the branch-liquid-passage tube 25, and the branch-liquid-passage tube 26 are liquid-passage tubes for supplying the ink to the head module 70.

What is claimed is:

1. A head unit to be installed in a liquid ejection apparatus, the head unit comprising:
    a head module comprising a nozzle surface in which a plurality of nozzles are opened;
    a casing connected to the head module and defining an inner space of the head unit;
    a first liquid-passage tube disposed in the inner space defined by the casing;
    a first connector connected to the first liquid-passage tube in the inner space defined by the casing, a part of the first connector being positioned outside the casing;
    a first branch-liquid-passage tube disposed in the inner space and fluidically connected to the first liquid-passage tube;
    a second branch-liquid-passage tube disposed in the inner space and fluidically connected to the first liquid-passage tube;
    a first tube joint disposed in the inner space and connecting the first liquid-passage tube to the first branch-liquid-passage tube and the second branch-liquid-passage tube such that the first branch-liquid-passage tube and the second branch-liquid-passage tube branch off from the first liquid-passage tube;
    a second liquid-passage tube disposed in the inner space defined by the casing;
    a second connector connected to the second liquid-passage tube in the inner space defined by the case, a part of the second connector being positioned outside the casing;
    a third branch-liquid-passage tube disposed in the inner space defined by the casing and fluidically connected to the second liquid-passage tube;
    a fourth branch-liquid-passage tube disposed in the inner space defined by the casing and fluidically connected to the second liquid-passage tube; and
    a second tube joint disposed in the inner space defined by the casing and connecting the second liquid-passage tube to the third branch-liquid-passage tube and the fourth branch-liquid-passage tube such that the third branch-liquid-passage tube and the fourth branch-liquid-passage tube branch off from the second liquid-passage tube,
    wherein the head module comprises:
        a first liquid-passage opening fluidically connected to the first branch-liquid-passage tube;
        a second liquid-passage opening fluidically connected to the second branch-liquid-passage tube;
        a third liquid-passage opening fluidically connected to the third branch-liquid-passage tube; and
        a fourth liquid-passage opening fluidically connected to the fourth branch-liquid-passage tube, and
    wherein the first tube joint is disposed between the second connector and the second tube joint when viewed in a direction parallel with the nozzle surface.

2. The head unit according to claim 1, wherein the first tube joint comprises:
    a first connection opening to which the first branch-liquid-passage tube is connected; and
    a second connection opening to which the second branch-liquid-passage tube is connected, the second connection opening being located next to the first connection opening in a direction parallel with the nozzle surface, and
    wherein the second tube joint comprises:
    a third connection opening to which the third branch-liquid-passage tube is connected; and
    a fourth connection opening to which the fourth branch-liquid-passage tube is connected, the fourth connection opening being located next to the third connection opening in a direction that coincides with a direction parallel with the nozzle surface and intersects the direction in which the first connection opening and the second connection opening are arranged.

3. The head unit according to claim 2, wherein the first liquid-passage opening, the third liquid-passage opening, the fourth liquid-passage opening, and the second liquid-passage opening are arranged in a direction parallel with the nozzle surface in an order of the first liquid-passage opening, the third liquid-passage opening, the fourth liquid-passage opening, and the second liquid-passage opening.

4. The head unit according to claim 3, wherein a distance between the third connection opening and the fourth connection opening is substantially equal to a distance between the third liquid-passage opening and the fourth liquid-passage opening.

5. The head unit according to claim 3, wherein the first connector is disposed on an inner side of the second connector in a direction orthogonal to the direction in which the first liquid-passage opening, the third liquid-passage opening, the fourth liquid-passage opening, and the second liquid-passage opening are arranged.

6. The head unit according to claim 1, wherein a length of the first liquid-passage tube is substantially equal to a length of each of the third branch-liquid-passage tube and the fourth branch-liquid-passage tube.

7. The head unit according to claim 1, wherein a length of the second liquid-passage tube is substantially equal to a length of each of the first branch-liquid-passage tube and the second branch-liquid-passage tube.

8. The head unit according to claim 1, further comprising a circuit board having an elongated shape,
    wherein a first end of the circuit board in a direction orthogonal to the nozzle surface is nearer to the head module than to the first connector and the second connector,
    wherein a second end of the circuit board in the direction orthogonal to the nozzle surface is nearer to the first connector and the second connector than to the head module, and
    wherein the circuit board comprises a board narrow portion that is nearer to the first end than to the second end, and the board narrow portion is formed by cutting out a portion of one of opposite edge portions of the circuit board in a direction parallel with the nozzle surface.

9. The head unit according to claim 8, wherein the board narrow portion intersects at least one of the first branch-liquid-passage tube, the second branch-liquid-passage tube, the third branch-liquid-passage tube, and the fourth branch-liquid-passage tube.

10. The head unit according to claim 8, further comprising a fastening plate having an elongated shape and disposed between the circuit board and the first tube joint, the fastening plate being configured to fasten the circuit board, wherein a first end of the fastening plate in the direction orthogonal to the nozzle surface is nearer to the head module than to the first connector and the second connector, wherein a second end of the fastening plate in the direction orthogonal to the nozzle surface is nearer to the first connector and the second connector than to the head module, and wherein the fastening plate comprises a fastening-plate narrow portion that is nearer to the first end of the fastening plate than to the second end of the fastening plate, and the fastening-plate narrow portion is formed by cutting out a portion of one of opposite edge portions of the fastening plate in a direction parallel with the nozzle surface.

11. The head unit according to claim 10, wherein the fastening-plate narrow portion intersects at least one of the first branch-liquid-passage tube, the second branch-liquid-passage tube, the third branch-liquid-passage tube, and the fourth branch-liquid-passage tube.

12. The head unit according to claim 10, wherein a portion of the fastening plate which is formed by cutting out a portion of one of longitudinal-side edge portions of the fastening plate extends along a longitudinal direction of each of the first branch-liquid-passage tube and the second branch-liquid-passage tube.

13. The head unit according to claim 8, wherein a portion of the second tube joint is disposed in a space formed by cutting out the portion of the one of the opposite edge portions of the circuit board in a direction parallel with the nozzle surface.

14. The head unit according to claim 1, wherein the first liquid-passage tube is provided with a filter.

15. The head unit according to claim 1, further comprising:
   a third connector connected to the liquid ejection apparatus and comprising a third communication opening communicating with a third communication liquid passage formed in the liquid ejection apparatus;
   a fourth connector connected to the liquid ejection apparatus and comprising a fourth communication opening communicating with a fourth communication liquid passage formed in the liquid ejection apparatus;
   a first cooling tube disposed in the casing and fluidically connected to the third communication opening;
   a second cooling tube disposed in the casing and fluidically connected to the first cooling tube;
   a third tube joint disposed in the casing and connecting the first cooling tube to the second cooling tube;
   a third cooling tube disposed in the casing and fluidically connected to the fourth communication opening;
   a fourth cooling tube disposed in the casing and fluidically connected to the third cooling tube; and
   a fourth tube joint disposed in the casing and connecting the third cooling tube to the fourth cooling tube,
   wherein the head module further comprises:
      a fifth liquid-passage opening fluidically connected to the second cooling tube; and
      a sixth liquid-passage opening fluidically connected to the fourth cooling tube, and
   wherein, when viewed in the direction parallel with the nozzle surface, the third tube joint and the fourth tube joint are disposed between the first tube joint and the head module.

16. The head unit according to claim 15, wherein a length of each of the first cooling tube and the third cooling tube is greater than a length of each of the second cooling tube and the fourth cooling tube.

17. The head unit according to claim 1, further comprising a common liquid passage communicating with the plurality of nozzles and connected to the first liquid-passage opening and the third liquid-passage opening,
   wherein the common liquid passage is formed in the head module.

18. A liquid ejection apparatus comprising a plurality of head units installed in the liquid ejection apparatus, the plurality of head units each comprising:
   a head module comprising a nozzle surface in which a plurality of nozzles are opened;
   a casing connected to the head module and defining an inner space of the head unit;
   a first liquid-passage tube disposed in the inner space defined by the casing;
   a first connector connected to the first liquid-passage tube in the inner space defined by the casing, a part of the first connector being positioned outside the casing;
   a first branch-liquid-passage tube disposed in the inner space and fluidically connected to the first liquid-passage tube;
   a second branch-liquid-passage tube disposed in the inner space and fluidically connected to the first liquid-passage tube;
   a first tube joint disposed in the inner space and connecting the first liquid-passage tube to the first branch-liquid-passage tube and the second branch-liquid-passage tube such that the first branch-liquid-passage tube and the second branch-liquid-passage tube branch off from the first liquid-passage tube;
   a second liquid-passage tube disposed in the inner space defined by the casing;
   a third branch-liquid-passage tube disposed in the inner space defined by the casing and fluidically connected to the second liquid-passage tube;
   a fourth branch-liquid-passage tube disposed in the inner space defined by the casing and fluidically connected to the second liquid-passage tube; and
   a second tube joint disposed in the inner space defined by the casing and connecting the second liquid-passage tube to the third branch-liquid-passage tube and the fourth branch-liquid-passage tube such that the third branch-liquid-passage tube and the fourth branch-liquid-passage tube branch off from the second liquid-passage tube,
   wherein the head module comprises:
      a first liquid-passage opening fluidically connected to the first branch-liquid-passage tube;
      a second liquid-passage opening fluidically connected to the second branch-liquid-passage tube;
      a third liquid-passage opening fluidically connected to the third branch-liquid-passage tube; and
      a fourth liquid-passage opening fluidically connected to the fourth branch-liquid-passage tube, and
   wherein the first tube joint is disposed between the second connector and the second tube joint when viewed in a direction parallel with the nozzle surface.

* * * * *